(12) United States Patent
Bindner et al.

(10) Patent No.: US 6,240,195 B1
(45) Date of Patent: May 29, 2001

(54) HEARING AID WITH DIFFERENT ASSEMBLIES FOR PICKING UP FURTHER PROCESSING AND ADJUSTING AN AUDIO SIGNAL TO THE HEARING ABILITY OF A HEARING IMPAIRED PERSON

(75) Inventors: Joerg Bindner, Weisendorf; Ullrich Sigwanz, Hausen, both of (DE)

(73) Assignee: Siemens Audiologische Technik GmbH, Erlangen (DE)

( * ) Notice: Subject to any disclaimer, the term of this patent is extended or adjusted under 35 U.S.C. 154(b) by 0 days.

(21) Appl. No.: 09/079,032

(22) Filed: May 15, 1998

(30) Foreign Application Priority Data

May 16, 1997 (DE) .............................. 197 20 651

(51) Int. Cl.[7] .................................................. H04R 25/00
(52) U.S. Cl. ......................... 381/316; 381/320; 375/372
(58) Field of Search ........................... 381/316, 67, 312, 381/320, FOR 127, FOR 129, FOR 131, 321, 317, 318; 375/372

(56) References Cited

U.S. PATENT DOCUMENTS

| | | | |
|---|---|---|---|
| 4,366,349 | * 12/1982 | Adelman | 381/316 |
| 4,419,544 | 12/1983 | Adelman | |
| 4,637,402 | * 1/1987 | Adelman | 381/316 |
| 4,792,145 | * 12/1988 | Eisenberg et al. | 381/67 |
| 4,809,708 | * 3/1989 | Geisler et al. | 381/68 |
| 4,868,880 | * 9/1989 | Bennett, Jr. | 381/68.2 |
| 5,029,217 | * 7/1991 | Chabries et al. | 381/68.2 |
| 5,233,665 | * 8/1993 | Vaughn et al. | 381/97 |
| 5,386,475 | * 1/1995 | Birck et al. | 381/68 |
| 5,394,475 | * 2/1995 | Ribic | 381/318 |
| 5,581,620 | * 12/1996 | Brandstein et al. | 381/92 |
| 5,649,019 | * 7/1997 | Thomasson | 381/83 |
| 5,651,071 | * 7/1997 | Lindemann et al. | 381/68.2 |
| 5,771,331 | * 6/1998 | Aoki et al. | 386/68 |
| 5,867,581 | * 2/1999 | Obara | 381/312 |
| 5,892,836 | * 4/1999 | Ishige et al. | 381/316 |
| 5,974,485 | * 10/1999 | Kruschinski | 710/52 |
| 6,009,231 | * 12/1999 | Aoki et al. | 386/68 |
| 6,049,617 | * 4/2000 | Sigwanz et al. | 381/312 |

FOREIGN PATENT DOCUMENTS

| | | |
|---|---|---|
| 398 670 | 1/1995 | (AU) . |
| 0 329 383 | 8/1989 | (EP) . |
| 8-317496 | 11/1996 | (JP) . |
| WO 95/25414 | 9/1995 | (WO) . |

* cited by examiner

Primary Examiner—Huyen Le
Assistant Examiner—P. Dabney
(74) Attorney, Agent, or Firm—Schiff Hardin & Waite

(57) ABSTRACT

A hearing aid with different assemblies for picking up, further processing and adjusting an acoustic signal to the hearing ability of a hearing impaired person, wherein a digital signal processing is performed in the hearing aid, has a buffer storage unit which shifts or transposes a defined frequency region into another frequency region which is better detectable by the wearer of the hearing aid. The buffer storage unit has individual storage segments for receiving and storing digital data representing acoustic content of an incoming audio signal, and the read-in and read-out frequency of the buffer storage unit differs by a defined factor.

16 Claims, 3 Drawing Sheets

HEARING AID WITH DIFFERENT ASSEMBLIES FOR PICKING UP FURTHER PROCESSING AND ADJUSTING AN AUDIO SIGNAL TO THE HEARING ABILITY OF A HEARING IMPAIRED PERSON

BACKGROUND OF THE INVENTION

1. Field of the Invention

The present invention relates to a hearing aid with different assemblies for receiving further processing and adjusting an audio signal to the hearing ability of a hearing impaired person, wherein digital processing is performed in the hearing aid.

2. Description of the Prior Art

In the case of a hearing aid wearer having extremely low residual hearing, the hearing disability Is usually such that a partial cutoff of high pitched sounds occurs in a frequency region between 1 kHz and 2 kHz. In this cutoff of high pitch, the region between the hearing barrier and the discomfort barrier is very narrow, such that the region of an audio signal which is important for speech recognition cannot be satisfactorily detected, even given very high amplification. On the other hand, it should be avoided that the amplification becomes too high and the discomfort barrier is thereby crossed. The dynamic of the hearing field is about 100 dB in someone with normal hearing and can recede to 10 dB in a hearing-impaired person. Thus far, attempts to bring about an amplification adjustment in the hearing field have been accompanied by uncomfortable side effects—such as feedback-produced whistling tones or other acoustical disturbances—due to the high amplification.

SUMMARY OF THE INVENTION

It is an object of the present invention to provide a hearing aid of the type initially described wherein, given digital signal processing, an effective amplification is guaranteed without disturbing side effects, even in the region of the compressed hearing field.

The above object is achieved in a hearing aid constructed in accordance with the principles of the present invention having a number of different assemblies for picking up, processing and adjusting an acoustic signal to match a hearing ability (disability) of a hearing impaired person, wherein digital signal processing is performed in the hearing aid, the hearing aid having a buffer storage unit with a number of individual storage elements for receiving and storing digital data representing audio content of an incoming audio signal, the buffer storage unit shifting or transposing the digital data in a predetermined frequency region into another frequency region which is more easily detectable (understandable) to the hearing impaired person. The read-in frequency and the read-out frequency of the buffer storage unit differ by a defined factor, and the buffer storage unit is in the form of a ring buffer with a number of read-in pointers and/or a number of read-out pointers which designate the data to be read into and out of the individual storage segments of the ring buffer. The data which are read out from storage segments indicated by the number of read-out pointers are superimposed (added).

In accordance with the invention a buffer storage unit is provided which shifts or transposes a defined frequency region into another frequency region. The buffer storage unit has individual storage segments for data representing audio content, and the read-in and read-out frequencies of the buffer storage unit differ by a defined factor. A sound signal lying in a region which is no longer (or poorly) detectable by the hearing impaired person is thus shifted into a frequency region which is better detectable by this person, particularly a lower region. Thus, the hearing impaired person can detect the audio content despite the original audio signal being a high-frequency signal.

The read-in and read-out frequency preferably have a rational relation to one another. This results from a corresponding defining of the read-in and read-out frequency. For example, the ratio of read-in to read-out frequency can be 3/2, the input frequency thereby being reduced to the output frequency by 3/2.

The shifting of the frequency region preferably occurs by one or more octave steps. A tonal distortion or disturbance of the audio signal thus is counteracted.

In an embodiment the data representing audio content is temporarily stored in the buffer storage unit for a time period of 28 ms at the most preferably 25 ms, since a degradation of the speech intelligibility would otherwise result. This temporarily stored time period corresponds to the time period for which the data remains in the buffer storage unit between the respective read-in and read-out. A longer temporarily stored time period would produce an echo between the read-in and the read-out which would reduce the speech intelligibility.

In a further embodiment a high-pass filter is connected upstream of the buffer storage unit, since lower disturbance effects occur, given the selection of higher frequencies in the region of the buffer storage unit. The filtering out of the low frequencies has the advantage that the bounces arising in the region of the read-in and read-out remain small.

A frequency shift for different frequency bands in the allocated buffer storage unit can occur in a band-selective fashion. For example, in one frequency region, a shift of one octave is performed; in another frequency region, a shift of only half an octave is performed. It is thereby achieved that the more detectable or less detectable frequency region is shifted into the optimal frequency region for the hearing impaired person.

To minimize disturbances in the frequency shift, preferably a read-in and read-out occur at locations of equal signal amplitude. In this way, negative influences due to signal jumps are avoided.

In another embodiment two buffer storage units can be provided which are connected in parallel, for example, wherein one buffer storage is first written (filled) to capacity and analyzed, and the other buffer storage unit is then controlled, such that the read-in and read-out take place at locations of equal signal amplitude. Locations of equal signal amplitude are, for example, the zero crossings or locations of the sound wave having the same first derivative.

An advantageous signal processing can also be accompanied by superimposition of the shifted frequency region with the base signal. Thus, the frequency shift described above is used in the signal processing in a hearing aid merely in a supporting fashion, wherein the base signal is maintained. To the extent that this signal is mixed into the original signal, the shift should merely be performed by one octave or by octave steps, since degradation of the speech intelligibility could otherwise result.

The buffer storage unit can be constructed as a ring buffer. The ring buffer can have read-in and read-out pointers, wherein the frequency shift is defined by the ratio of the number of read-in pointers to read-out pointers. Thus, data are not lost in the ring buffer, since all the data which flow into the ring buffer via the read-in pointers are emitted again via the read-out pointers. Moreover, it is possible to perform an exact frequency adjustment by the number of read-in and read-out pointers.

Finally, an interface for an external programming unit can be attached to the hearing aid in order to perform a seated configuration of the hearing aid and to enter the input and output speeds. To this end, a control unit is connected in the hearing aid to the interface and is connected directly with the ring buffer.

With the entered settings, the control unit thus controls the mode of operation of the ring buffer. With the aid of this arrangement it is thus possible to flexibly adjust the operation of the ring buffer.

It is also possible to connect a storage unit in the hearing aid between the control unit and the interface, this storage unit storing the settings entered via the external programming unit and forwarding these settings, as needed, to the control unit.

A second possibility of frequency shift operates on the basis of Fourier transformation, which creates a shifting of spectral lines with equidistant frequency spacings. In such a transformation, all spectral lines are separated by 400 Hz from each other, for example.

Preferably, the Fourier transformation is a discrete Fourier transformation, or fast Fourier transformation.

DESCRIPTION OF THE PREFERRED EMBODIMENTS

Figure 1:
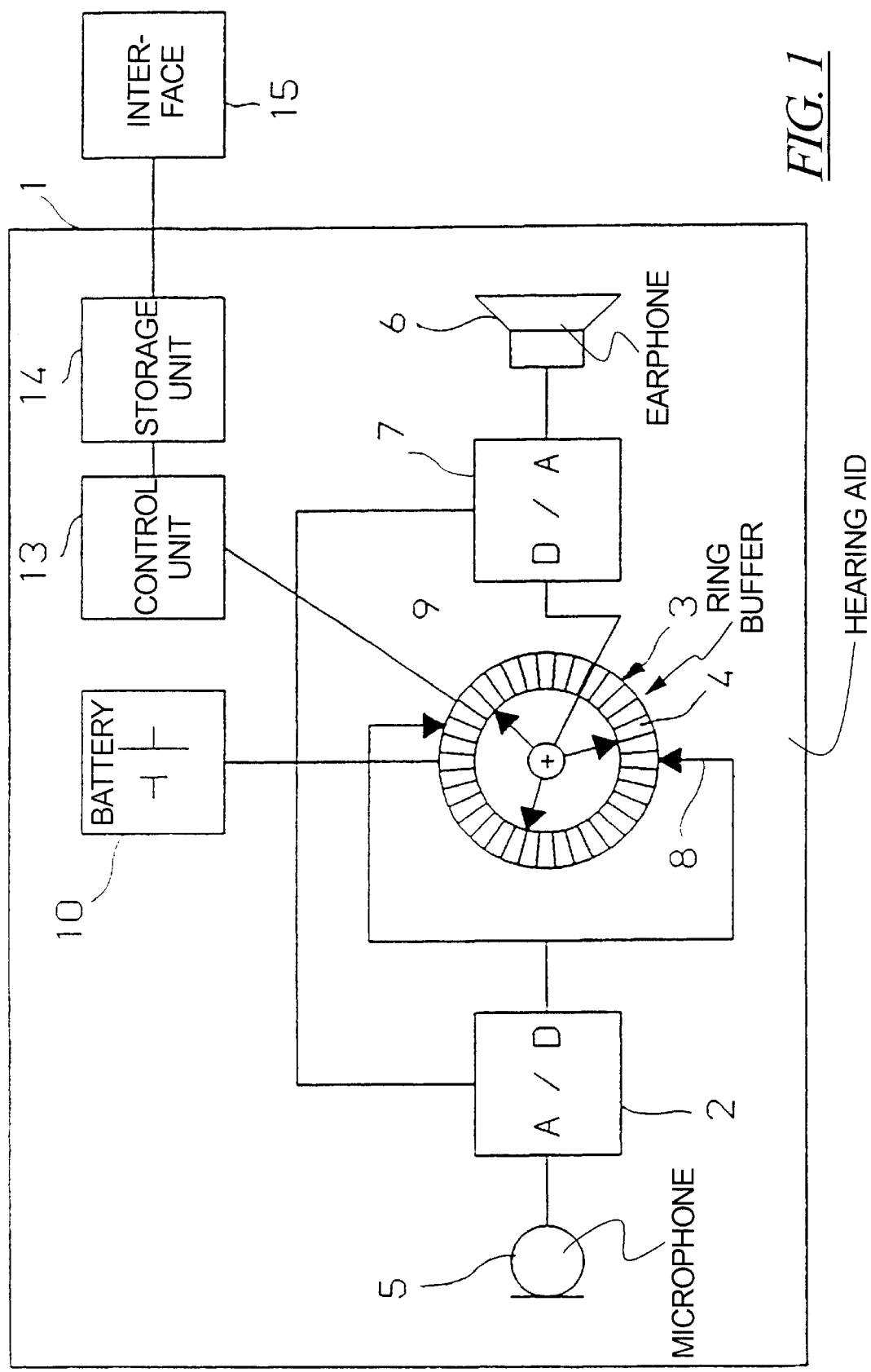
FIG. 1 is a simplified basic black diagram of the inventive hearing aid.

The inventive hearing aid I schematically depicted in FIG. 1 picks up audio signals via a microphone 5. In microphone 5, these audio signals are transduced into electrical signals. In an amplifier (not further depicted) connected to microphone 5, the electrical output signals of the microphone 5 are amplified. The signals produced in this manner are subsequently converted into digital form in an A/D converter 2. A ring buffer 3 is connected to the A/D converter 2, this buffer 3 shifting or transposing a defined frequency region into another frequency region. The ring buffer 3 has individual storage segments 4 which serve to receive and store different items of audio content (in digital bit sequences). Two read-in pointers 8 and three read-out pointers 9 are further arranged in the exemplarily depicted ring buffer 3. The ratio of the number of read-in pointers 8 to read-out pointers 9 defines the (amount) size of the frequency shift. The read-in and read-out frequencies of the ring buffer 3 differ by a defined factor. The read-in and read-out frequencies have in a rational relation to one another—3/2 in the present example. The ring buffer 3 is constructed such that no data are lost. A D/A converter 7 is connected at the ring buffer 3 in order to transform the shifted digital frequencies into analog signals again. The electrical-acoustical transducing finally occurs in the earpiece 6. Along with the earpiece 6, the D/A converter 7 can be replaced by a digital sound transducer which functions without explicit analog transformation. The hearing aid 1 is powered by a battery 10.

The shifting of the frequency region preferably occurs by at least one octave step, so that an optimally distortion-free reproduction of the audio signal is guaranteed.

The audio signal is temporarily stored in the ring buffer 3 for a time period of 23 ms to 28 ms at the most—preferably 25 ms—in order to avoid an echo between the read-in and read-out pointers which would otherwise degrade the speech intelligibility considerably. This temporarily stored time period corresponds to t the time period between a read-in pointer 8 and a read-out pointer 9 of the ring buffer 3.

Figure 2A:
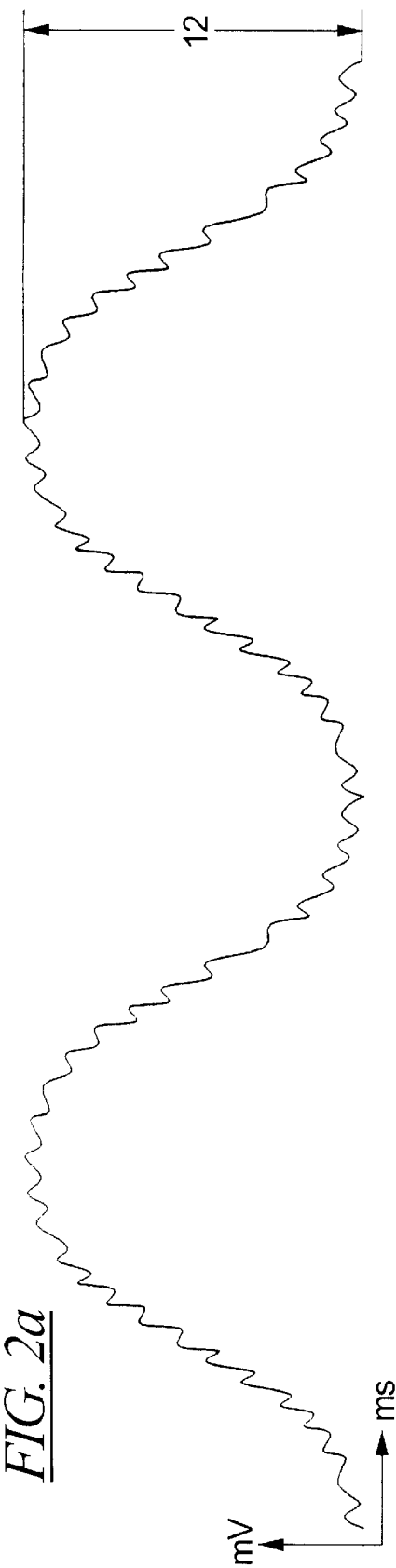
FIG. 2a shows the audio signal waveform before high-pass filtering in the hearing aid of FIG. 1.
Figure 2B:
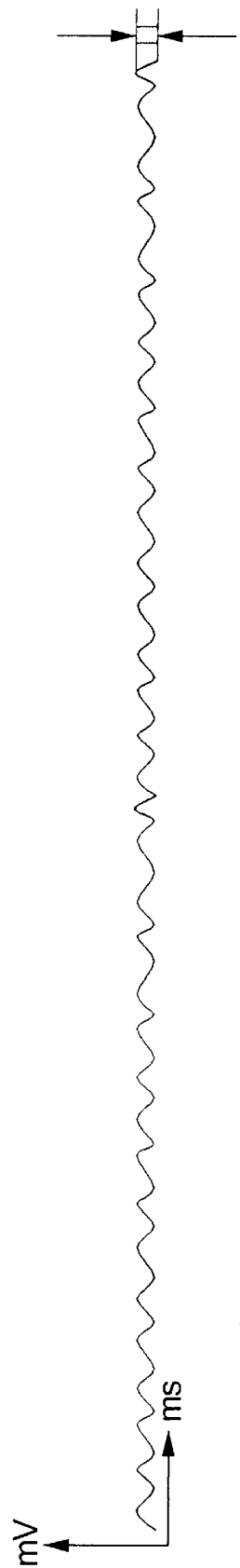
FIG. 2b shows the audio signal waveform after high-pass filtering in the hearing aid of FIG. 1.

It is also possible to connect a high-pass filter (not further depicted) upstream to the ring buffer 3 in order to filter out the low frequencies. The effect of the high-pass filter is illustrated in FIGS. 2a and 2b wherein the horizontal axis represents time (in, for example, ms) and the vertical axis represents amplitude (in, for example, mv). A higher jump 12—as depicted in FIG. 2a—can no longer take place due to the filtering out of the low frequencies. At the most, a jump 11 can arise—as depicted in FIG. 2b. The speech intelligibility is thereby less compromised.

A still further optimized frequency adjustment is achieved, because the frequency shift for different frequency bands occurs band-selectively in respectively allocated buffer storage units 4.

Figure 3:
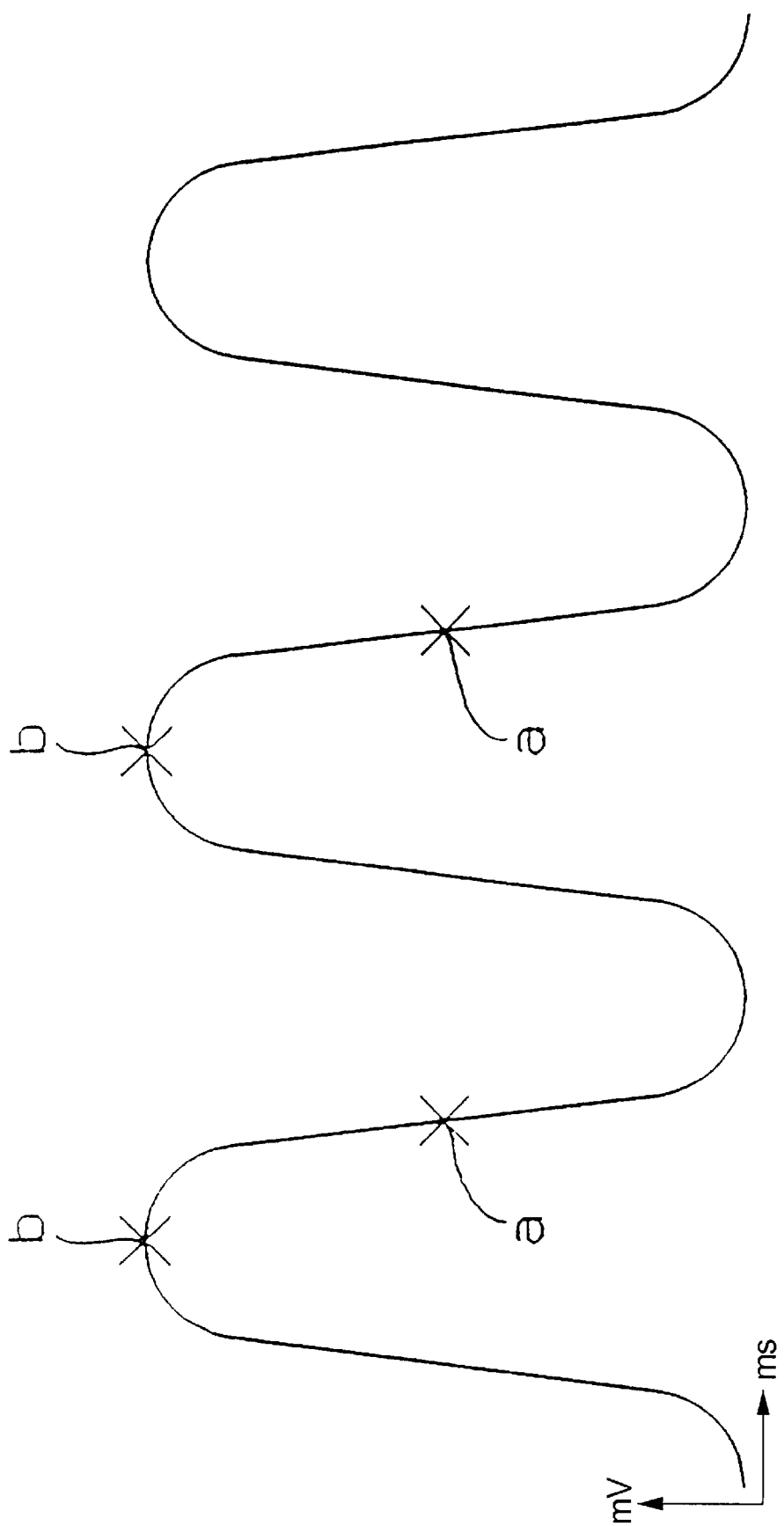
FIG. 3 shows a signal waveform wherein corresponding read-in and read-out locations a and b are designated.

To avoid negative influences due to jumps which may nevertheless arise, another ring buffer can be provided in addition to the first ring buffer 3, this other ring buffer being set such that the read-in and read-out takes place at locations of equal signal amplitude a and b, as depicted in FIG. 3.

An alternative the above-described frequency adjustment is to superimpose the shifted frequency region with the original base signal, so that the specific signal processing is performed merely in a supporting fashion with respect the base signal.

In order to allow the function mode of the ring buffer 3 to be flexibly adjusted, an interface 15 is provided on the hearing aid 1 in order to deliver enter settings (configuration, read-in and read-out rates) from an external programming unit to a storage means 14. Ultimately, these stored settings set the desired mode of operation of the ring buffer 3 via a control unit 14.

Instead of the ring buffer 3 depicted in FIG. 1, a computer unit for carrying out a Fourier transformation can also be provided, for example, which creates a shifting of spectral lines with equidistant frequency separations. The Fourier transformation can either be a discrete Fourier transformation or a fast Fourier transformation.

Although modifications and changes may be suggested by those skilled in the art, it is the intention of the inventors to embody within the patent warranted hereon all changes and modifications as reasonably and properly come within the scope of their contribution to the art.

We claim as our invention:

1. A hearing aid comprising:

acoustoelectrical transducer means for picking up incoming analog audio signals and for producing digital signals corresponding thereto, said digital signals having an audio content;

buffer storage means, supplied with said digital signals, for shifting said digital signals from a first frequency region into a second frequency region, said buffer storage means comprising a ring buffer having a plurality of storage segments in which said digital signals are respectively stored, at least one read-in pointer and a plurality of read-out pointers for respectively reading said digital signals into respective storage segments and reading-out said digital signals from respective storage segments at a read-in frequency and a read-out frequency which differ by a predetermined factor;

means for adding the audio content of the digital signals respectively read-out from the storage segments designated by said plurality of read-out pointers to produce a sum signal; and electroacoustical transducer means for converting said sum signal into an outgoing audio signal.

2. A hearing aid as claimed in claim 1 wherein said buffer storage means comprises means for operating said at least one read-in pointer and said plurality of read-out pointers at a read-in frequency and a read-out frequency having a rational relation to each other.

3. A hearing aid as claimed in claim 1 wherein said buffer storage means comprises means for shifting said first frequency region to said second frequency region by at least one octave step.

4. A hearing aid as claimed in claim 1 wherein said buffer storage means comprises means for temporarily storing said digital signals therein for a time period not exceeding 23 ms to 28 ms.

5. A hearing aid as claimed in claim 1 wherein said buffer storage means comprises means for temporarily storing said digital information therein for a time period not exceeding 25 ms.

6. A hearing aid as claimed in claim 1 further comprising a high-pass filter connected preceding said buffer storage means.

7. A hearing aid as claimed in claim 1 wherein said buffer storage means comprises means for shifting said digital signals infrequency through different frequency bands in a band-selective fashion.

8. A hearing aid as claimed in claim 1 wherein said incoming audio signal has a varying amplitude, and wherein said buffer storage means comprises means for reading-in and reading-out the digital signals corresponding to said incoming audio signal at locations of equal signal amplitude.

9. A hearing aid as claimed in claim 1 wherein said buffer storage means comprises first buffer storage means, and wherein said hearing aid further comprises second buffer storage means into which said digital signals are entered if said first buffer storage means is first filled to capacity, and said second buffer storage means comprises means for reading-in and reading-out digital signals of equal signal amplitude.

10. A hearing aid as claimed in claim 1 wherein said incoming audio signal includes a base signal, and wherein said buffer storage means comprises means for superimposing digital signals in said second frequency region on said base signal.

11. A hearing aid as claimed in claim 1 wherein said ring buffer comprises a plurality of read-in pointers having a ratio to the plurality of read-out pointers, said ratio defining said shift of said first frequency region to said second frequency region.

12. A hearing aid as claimed in claim 1 further comprising an interface having an externally accessible terminal adapted for connection to an external programming unit, and a control unit connected between said interface and said ring buffer for controlling said ring buffer dependent on settings supplied from said external programming unit via said interface.

13. A hearing aid as claimed in claim 12 further comprising memory means connected between said control unit and said interface for storing said settings.

14. A hearing aid comprising:

acoustoelectrical transducer means for converting an incoming analog audio signal into corresponding digital signals;

computer means supplied with said digital signals for conducting a Fourier transformation of the incoming audio signal represented by said digital signals including shifting spectral lines with equidistant frequencies separations to produce a Fourier transformed digital signal; and electroacoustical transducer means for converting said Fourier transformed signal into an outgoing audio signal.

15. A hearing aid as claimed in claim 14 wherein said computer means comprises means for conducting a discrete Fourier transformation.

16. A hearing aid as claimed in claim 14 wherein said computer means comprises means for conducting a fast Fourier transformation.

* * * * *